United States Patent
Koprowski et al.

(12) 
(10) Patent No.: US 6,442,723 B1
(45) Date of Patent: Aug. 27, 2002

(54) LOGIC BUILT-IN SELF TEST SELECTIVE SIGNATURE GENERATION

(75) Inventors: Timothy J. Koprowski, Newburgh; Franco Motika, Hopewell Junction, both of NY (US); Phillip J. Nigh, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/310,445

(22) Filed: May 12, 1999

(51) Int. Cl.[7] .......................................... G01R 31/3185
(52) U.S. Cl. ........................................ 714/732
(58) Field of Search ............................... 714/326, 328, 714/733, 724, 729, 738, 732

(56) References Cited

U.S. PATENT DOCUMENTS

| | | | | |
|---|---|---|---|---|
| 5,150,366 A | * | 9/1992 | Bardell, Jr. et al. | 714/728 |
| 5,572,712 A | * | 11/1996 | Jamal | 716/18 |
| 6,154,715 A | * | 11/2000 | Dinteman et al. | 702/120 |
| 6,158,033 A | * | 12/2000 | Wagner et al. | 714/726 |
| 6,199,184 B1 | * | 3/2001 | Sim | 714/732 |
| 6,260,165 B1 | * | 7/2001 | Whetsel | 714/727 |

OTHER PUBLICATIONS

W. H. McAnney et al., "Improving the Diagnostic Resolution of Built–In Test" Jan. 1988, IBM Technical Disclosure Bulletin vol. 30, No. 8, pp. 478–480.

E. M. Barna, "Self–Test Diagnosis Using Parallel Superposition" Jul. 1985, IBM Technical Disclosure Bulletin vol. 28 No. 2, pp. 609–614.

W. H. McAnney, "Diagnosis of Self–Test Failures" Feb. 1984, IBM Technical Disclosure Bulletin vol. 26, No. 9, pp. 4483–4488.

* cited by examiner

*Primary Examiner*—Albert Decady
*Assistant Examiner*—Cynthia Harris
(74) *Attorney, Agent, or Firm*—Cantor Colburn LLP; Lynn Augspurger

(57) ABSTRACT

LBIST resource parameters are used to control the data inputs for the signature generation process. These resource parameters include a LBIST pattern cycle counter, a channel input selected to input the MISR, and a channel load/unload shift counter. Properly setting one or more of these resource parameters to conditionally control those latch content values that get clocked into the MISR during the unload operation generates a three dimensional signature space.

24 Claims, 3 Drawing Sheets

LOGIC BUILT-IN SELF TEST SELECTIVE SIGNATURE GENERATION

FIELD OF THE INVENTION

This invention relates to an improved Logic Built In self Test (LBIST) and more particularly to a LBIST system which facilitates the isolation of faults.

DOCUMENTS INCORPORATED HEREIN BY REFERENCE:

"Built-In Test for Complex Digital Integrated Circuits", B. Könemann, J. Mucha, G. Zwiehoff, IEEE Journal of Solid State Circuits, Vol. SC-15 No. 3, pp. 315–318, June 1980. "Circular Self-Test Path: A Low-Cost Bist Technique", Andrzej Krasniewski, Presented Jul. 7, 1987 at Princeton University. U.S. Pat. No. 4,071,902 to E. Eichelberger et al., U.S. Pat. No. 4,071,902. U.S. Pat. No. 5,150,366 to P. Bardell et al. Improving The Diagnostic Resolution of Built-in Test (IBM TDB1/Self-Test 88).

Diagnosis Using Parallel Superposition (IBM TDB7/85). Diagnosis of Self-Test Failures (IBM TDB2/84).

Trademarks: S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

As will be appreciated by those skilled in the art, the design of electronic integrated circuit chips and devices has progressed, more and more circuitry is being disposed in increasingly dense patterns and it is becoming correspondingly more difficult to test and diagnose such circuits. One methodology for performing chip test is described in U.S. Pat. No. 4,071,902 issued to Edward Eichelberger, et al. on Jan. 31, 1978 and assigned to the same assignee as the present invention and incorporated herein by reference. This patent describes the basic features of a level sensitive scan design (LSSD) system. LSSD facilitates circuit testing and diagnostics. The circuits generally considered therein include digital circuits having logic and memory functions that are used in the design and construction of digital signal processing and information handling systems. Likewise here, integrated circuit devices of interest typically possess blocks of combinatorial logic whose inputs and outputs are supplied to certain memory elements. In particular, in an LSSD system the memory elements or circuits comprise shift register latches (SRLs). During test mode, these shift register latches can be logically reconfigured to operate as a shift register which is capable of providing logical inputs and storing logical output results and of moving or shifting these results into a storage register for comparison and analysis with known results.

LBIST designs employ a shift register sequence generator for generating pseudo-random bit sequences to be supplied to a plurality of shift register latch scan strings.

A prior art self-test system using MISR/Parallel SRSG called STUMPS is illustrated in FIG. 1 and is used to test integrated circuit chips and devices. The acronym SRSG stands for the Shift Register Sequence Generator. Such devices are typically implemented as linear feedback shift registers. These registers generally comprise a chain of shift register elements in which Exclusive-OR elements in a feedback loop are provided so as to combine several intermediate latch output signals which are returned to the shift register input. The feedback paths are configured to result in the generation of a pseudo-random sequence of binary digits which are employed as test sequences for the above mentioned combinatorial circuits. The design and construction of pseudo-random pattern generators in the form of linear feedback shift registers is well known in the art. Output signals from the SRSG are fed through channels to a plurality of different scan paths. Each scan path comprises a plurality of shift register latches. The output signals from the latch strings are supplied to signature register or MISR. It will be appreciated by those skilled in the art that the shift register latch elements also function in normal operation as sequential circuit memory elements in conjunction with combinatorial logic networks on, for example, a chip. The shift register latches function as memory elements between blocks of combinatorial logic. During operation of the circuit in normal system environment, the shift register latches function as memory elements passing signals to be processed from one combinatorial block to another and at the same time typically receiving input signals for subsequent application to combinatorial logic blocks in subsequent clock cycles. Thus the shift register latches play a significant role in establishing and defining stable logic outputs at appropriate points in a machine cycle. It is useful to keep in mind that the SRSG and the MISR are properly considered to be dedicated test elements. However, shift register latches serve a dual purpose which is more particularly apparent when considering the actual signal supplied to the shift register latches in normal operation.

Prior art response data compression techniques are very effective in reducing data volumes and test times, but as with any data compression scheme, some valuable information is lost. In the case of testing, this lost information consists of specific failing data required to diagnose the failing device and pinpoint the fault.

The current LBIST design and test methodology has evolved mainly in support of LSSD logic and structural testing. The STUMPS structure shown in FIG. 1 illustrates a typical system and chip design that incorporates these concepts (see references) This LBIST structure incorporates a Liner Feedback Shift Register (LFSR) and a Multiple Input Signature Register (MISR). The LFSR serves as a pseudo random pattern generator that provides the stimuli for the logic being tested, while the MISR is utilized to generate a unique signature representing the responses from the logic. Ideally the signature for each failing device is different from the signature of a good device after a predefined number of test cycles.

The prior art LBIST test methodology is very effective in identifying defective devices in a high throughput manufacturing environment since it requires very little initialization data and expected signatures, but achieves a high level of fault average. Conversely, when the cause of the failure needs to be diagnosed and identified, the above test methodology encounters severe diagnostic problems.

The current diagnostic approach for the LBIST methodology is to subdivide the test into smaller intervals of test cycles and provide an expected good signature for each interval. The signature is then used during test to identify the failing interval. Of course this failing interval consists of many test cycles and expected responses, some of which pass and others of which fail some or all of the measurements. Once the failing interval has been identified one of two different diagnostic methods have been used in the past to resolve the failing vectors and failing responses for those vectors.

The first method is to retest the failing interval in a full data collection mode in order to log all the failing and passing measurements for each vector in the interval. A retest can be performed on-the-fly or as a diagnostic retest pass at a later time. In either case the amount of response data being collected is proportional to the number of test cycles in the signature interval and quickly becomes very large and unmanageable for cost effective manufacturing test systems.

The second method is to generate, after the initial test, corresponding deterministic patterns equivalent to those in the failing signature interval. These patterns can then be reapplied to the failing device in a second pass test to determine the failing responses. The problem with this later method is that it requires expensive deterministic test data generation and a second pass test to collect the failing data.

SUMMARY OF THE INVENTION

An object of this invention is the provision of additional built in functions to the existing LBIST systems of the type shown in FIG. 1. These additional functions provide dynamically selectable signature generation modes that can be used to isolate and/or diagnose faults.

This invention contemplates the provision of a LBIST system of the type described in connection with FIG. 1 in which LBIST resource parameters are used to control the data inputs for the signature generation process. These resource parameters include a LBIST pattern cycle counter, a channel input selected to input the MISR, and a channel load/unload shift counter. Properly setting one or more of these resource parameters to conditionally control those latch content values that get clocked into the MISR during the unload operation generates a three dimensional signature space.

The first signature dimension is controlled by gating the MISR input active only for a specified range of LBIST patterns. This range may encompass all patterns greater than or equal to a predefined cycle count or less than a predefined cycle count.

The second signature dimension is controlled by selecting data from a specific STUMPS channel(s) to be gated into the corresponding MISR input. The complement of this condition is also selectable such that all but the specified STUMPS channel(s) are selected.

The third signature dimension is controlled by allowing the MISR input to be gated active only for a specific range of STUMPS channel unload cycles that is determined by a predefined start and stop count. As above, the complement of this condition can also be selected.

In addition to each individual signature dimension, one can also generate signatures by combining any or all the functions of each dimension simultaneously. In the finest resolution mode, one can generate the signature for a single latch on a single cycle. In other words, obtain the contents of a single latch for a single pattern.

Using repetitive application of the LBIST test with the selective signature generation function, some basic binary search algorithms, and on-the-fly signature comparison, one can quickly and easily identify the failing portion of the circuit or failing pattern. The diagnostic resolution can be optimized to locate:

Failing pattern sub-set.
Individual failing pattern(s).
Failing STUMPS channels.
Failing latch groups.
Individual failing latch(es).

Two modes of signature comparison can be used in this diagnostic process. The first approach, using off-line techniques, signatures are generated during the algorithmic test execution and then compared to previously generated "good" signatures.

The "good" signature generation depends on the type of test and diagnostic problem being addressed. Some common approaches which vary with the system environment, include:

The signatures are generated prior to test via a good machine simulator (GMS) and stored on the tester or system. This may require relatively large signature storage capacity on the tester, but need to be performed only once. If an interactive GMS is readily available during test, the storage problem can be significantly reduced.

An alternate approach is to use a reference or "golden" standard device instead of the software GMS. As in the previous case, the signatures can be generated and stored before the diagnostic testing or generated interactively. The drawback of this approach is that a reference device might not be available during the initial design verification diagnostics. Alternatively, the real hardware simulator is, in many instances, superior to the software GMS especially when AC and timing problems are being addressed.

The third approach, very powerful in some situations, is to use the same device under test to generate the "good" reference signatures. This can be accomplished when the device has an operating range that is functioning properly. This operating range might be at a slightly different voltage or timing conditions. In practice this is often the case and a suitable operating point can be easily found. In our experience, most of the diagnostic fails fall into this category.

DESCRIPTION OF THE DRAWINGS

The foregoing and other objects, aspects and advantages will be better understood from the following detailed description of a preferred embodiment of the invention, in which.

DETAILED DESCRIPTION OF THE INVENTION

Figure 1:
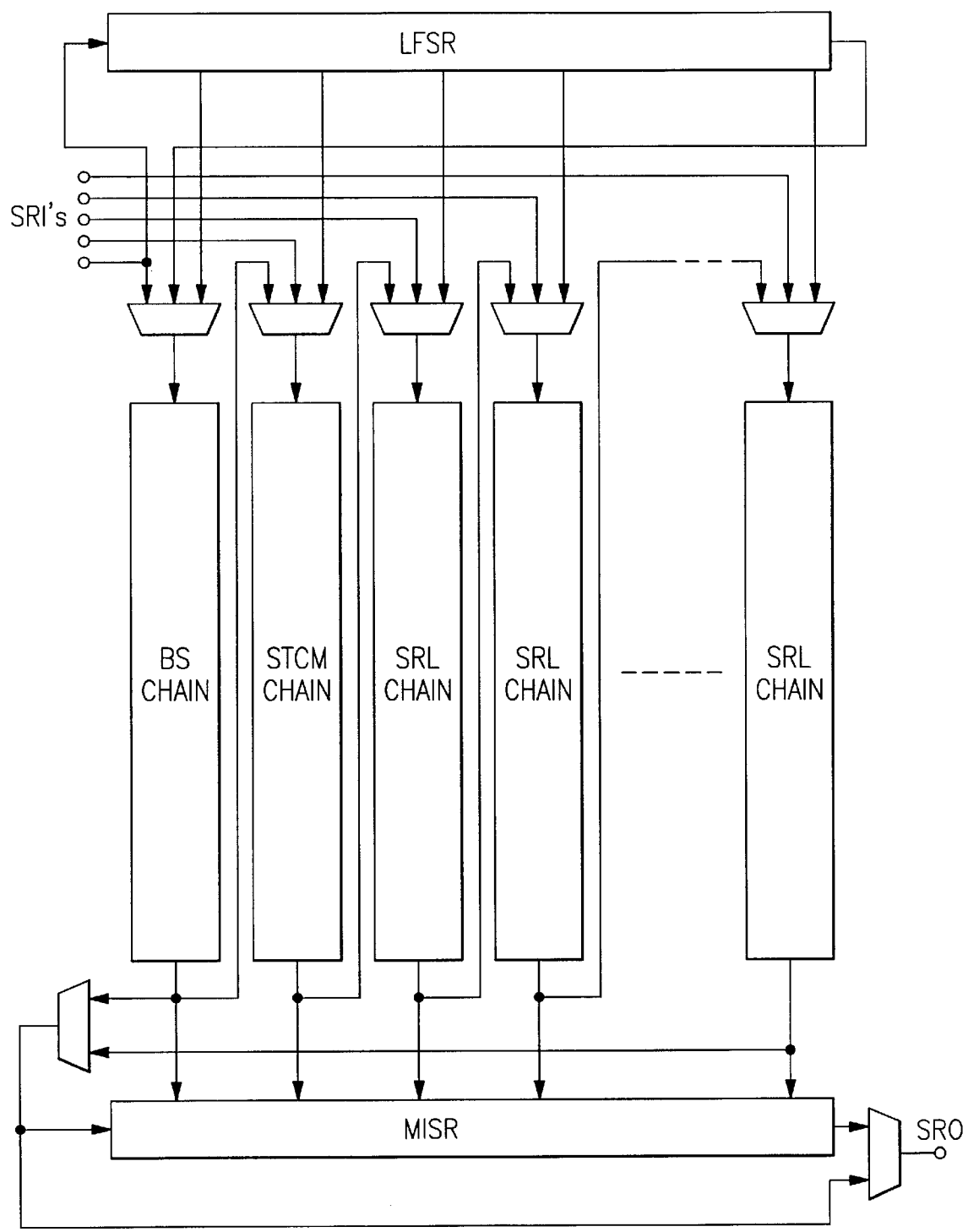
FIG. 1 is a block diagram of typical prior art STUMPS architecture.

The hardware implementation of the above methodology is relatively simple and requires very low circuit overhead. As mentioned above, LBIST selective signature generation can be easily incorporated into the STUMPS structure illustrated in FIG. 1 by adding a few basic signature generation functions to the LBIST engine. An embodiment of a basic selective signature generation configuration in accordance with the invention is shown in FIG. 2.

Figure 2:
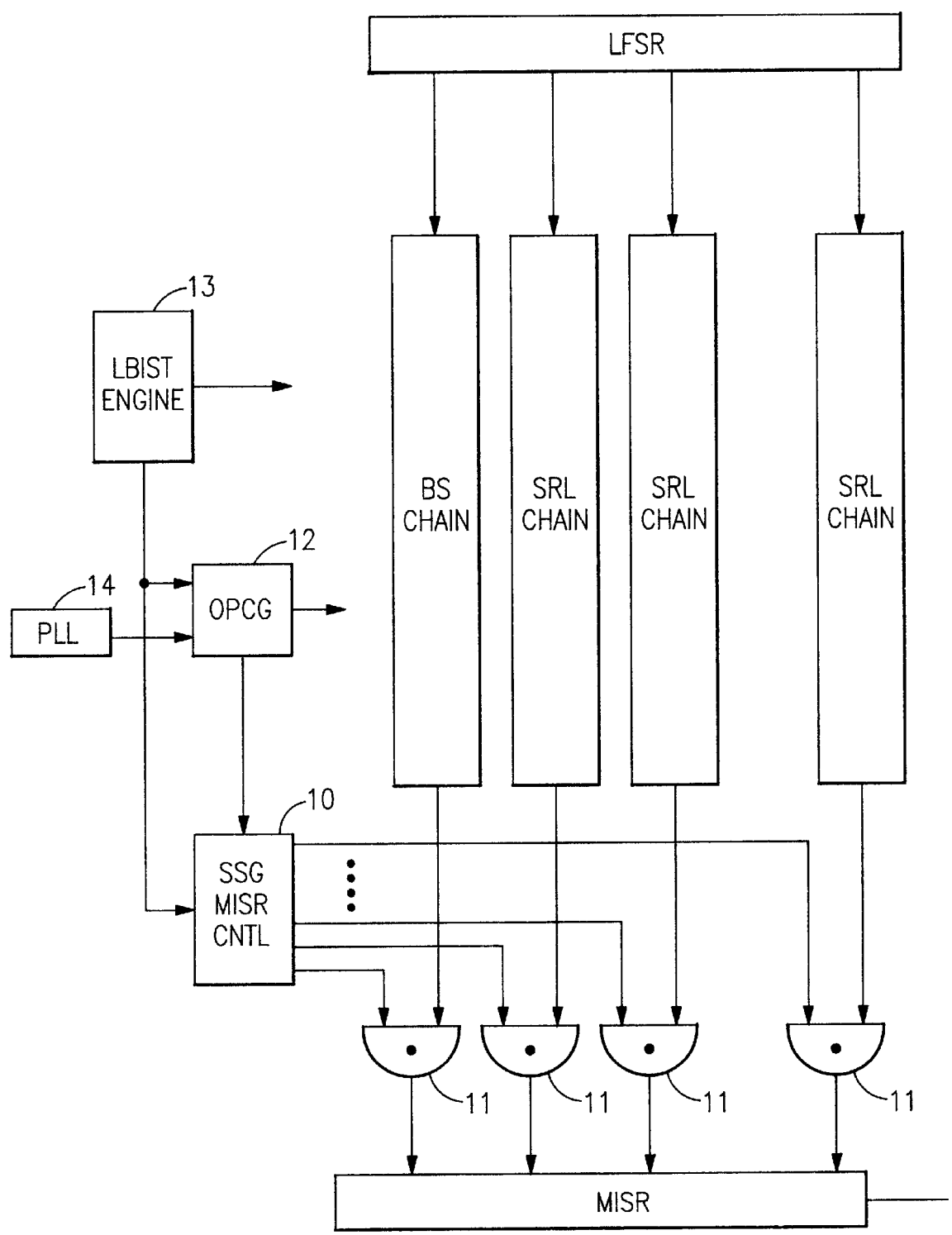
FIG. 2 is a block diagram of a selective signature generation configuration in accordance with the teaching of the invention for use in combination with the STUMPS architecture.

Referring to FIG. 2, MISR SSG control block 10 generates a gate enabling signal to a respective one or more of gates 11 for the MISR input on each cycle that data is to be clocked into the MISR. This MISR SSG control block 10 is in turn driven by the LBIST engine resources and synchronized with timing provided by an on-product-clock-generator (OPCG) function 12 and a phase-locked-loop (PLL) 14.

Although the MISR SSG control 10 is shown as a separate block, we envision the MISR SSG function to be an extension of LBIST and an integral part of the LBIST engine macro.

Figure 3:
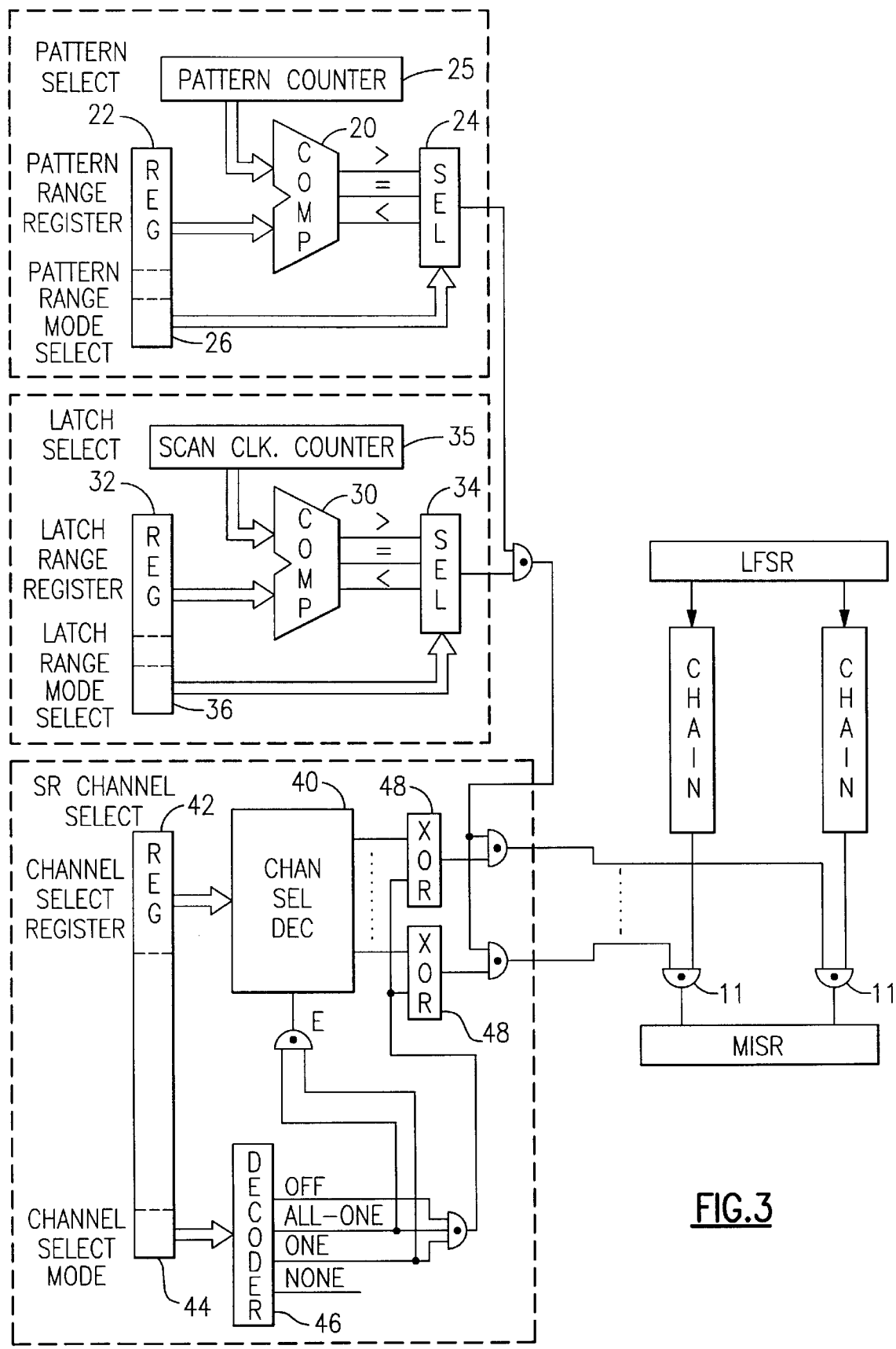
FIG. 3 is a block diagram of details of the MISR input gating control shown in FIG. 2.

FIG. 3 depicts the detail logic for each of the three selection modes (Pattern Select, Latch Select, SR Channel Select outlined by dotted line boxes) which comprise the SSG concept. The first two select functions, Pattern Select and Latch Select, are similar in design. While the third function, SR Channel Select, enables the output of a selected stumps chain(s) to the corresponding MISR input. The registers shown are an extension of the LBIST General Purpose Test Register (GPTR) and loaded by the user as required at the start of the LBIST test. Each function has a select data register and a smaller (2 bits) mode register.

The Pattern Selection function uses a comparator 20 to determine if the LBIST pattern input from Pattern Counter 25 is greater than, equal to, or less than a user loaded pattern in register 22. A selector 24 selects the appropriate condition as specified by a mode select register 26 so that a resulting output signal when coupled to the gates 11 transfers data into the MISR only during the desired LBIST pattern range specified by the Pattern Range register 22. The Latch Select function uses a comparator 30, a user loaded Latch Range register 32, a mode select register 36 and a selector 34 all similar in function to the components of the Pattern Selection function. In the Latch Select function, the LBIST scan clock counter 35 is used in place of the Pattern Counter 25. Here, the comparator 30 compares the output of the Scan Clock Counter 35 with the value in the user loaded Latch Range register 32. The resulting output signal of the selector 34 enables gates 11 to couple data to the MISR only for user specified SR STUMP chain latches.

The SR Channel Select function has a channel select decoder 40, a user loaded channel select register 42, a mode select register 44, and a decoder 46, which decodes the output of the mode select register 44. The outputs of the mode select register 44 include, all channels, all but one, one, and none. The channel select decoder 40 decodes the contents of the channel select register 42 to a single channel. XOR gates 48 are used when switching between a single selected chain and its complement of the all except one selection. It will be appreciated that this logic allows for all of the SR chains to be enabled (i.e. the normal LBIST mode of operation), a single specified SR chain, all of the SR chains except the single specified SR chain, and none of the SR chains.

The first signature dimension is controlled by gating the MISR input active only for a specified range of LBIST patterns. This range may encompass all patterns greater than or equal to a predefined cycle count or less than a predefined cycle count.

The second signature dimension is controlled by selecting data from a specific STUMPS channel(s) to be gated into the corresponding MISR input. The complement of this condition is also selectable such that all but the specified STUMPS channel(s) are selected.

The third signature dimension is controlled by allowing the MISR input to be gated active only for a specific range of STUMPS channel unload cycles that is determined by a predefined start and stop count. As above, the complement of this condition can also be selected.

In addition to each individual signature dimension, one can also generate signatures by combining any or all the function of each dimension simultaneously. In the finest resolution mode, one can generate the signature for a single latch on a single cycle. In other words, obtain the contents of a single latch for a single pattern.

Using repetitive application of the LBIST test with the selective signature generation function, some basic binary search algorithms, and on-the-fly signature comparison, one can quickly and easily identify the failing portion of the circuit or failing pattern. The diagnostic resolution can be optimized to locate:

Failing pattern sub-set.
Individual failing pattern(s).
Failing STUMPS channels.
Failing latch groups.
Individual failing latch(es).

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for isolating faults in a circuit by running BIST on the circuit, including the steps of:

forming a plurality of STUMPS channels from circuit latches;

connecting an output of each channel to an input of a signature register;

storing a dynamically selectable signature generation mode in response to user input; and directing the inputs of the signature register in response to said signature generation mode.

2. The method of claim 1 wherein:

said signature generation mode includes a selected range of BIST patterns in a test interval; and said directing includes gating the inputs of the signature register active only for said selected range of BIST patterns.

3. The method of claim 2 wherein said range includes all patterns greater than a user selected pattern count.

4. The method of claim 2 wherein said range includes all patterns less than a user selected pattern count.

5. The method of claim 2 wherein said range includes all patterns equal to a user selected pattern count.

6. The method of claim 2 wherein said range includes all patterns equal to a user selected pattern start-stop count.

7. The method of claim 1 wherein:

said signature generation mode includes a selected range of said STUMPS channels; and said directing includes gating the inputs of the signature register active only for said selected range of STUMPS channels.

8. The method of claim 7 wherein said range includes all said STUMPS channels.

9. The method of claim 7 wherein said range includes all but one of said STUMPS channels.

10. The method of claim 7 wherein said range includes one of said STUMPS channels.

11. The method of claim 7 wherein said range includes none of said STUMPS channels.

12. The method of claim 1 wherein:

said signature generation mode includes a selected range of STUMPS channel unload cycles; and said directing includes gating the inputs of the signature register active only for said selected range of STUMPS channel unload cycles.

13. The method of claim 12 wherein said range includes all cycles greater than a user selected cycle count.

14. The method of claim 12 wherein said range includes all cycles less than a user selected cycle count.

15. The method of claim 12 wherein said range includes all cycles equal to a user selected cycle count.

16. The method of claim 12 wherein said range includes all cycles equal to a user selected cycle start-stop count.

17. The method of claim 1 wherein:

said signature generation mode includes a selected range of BIST patterns in a test interval and a selected range of STUMPS channels; and said directing includes gating the inputs of the signature register active only for said selected range of BIST patterns and for said selected range of STUMPS channels.

18. The method of claim 1 wherein:

said signature generation mode includes a selected range of BIST patterns in a test interval and a selected range of STUMPS channel unload cycles; and said directing includes gating the inputs of the signature register active only for said selected range of BIST patterns and for said selected range of STUMPS channel unload cycles.

19. The method of claim 1 wherein:

said signature generation mode includes:
- a selected range of BIST patterns in a test interval;
  - a selected range of STUMPS channels; and
  - a selected range of STUMPS channel unload cycles; and
  - said directing includes gating the inputs of the signature register active only for:
- said selected range of BIST patterns;
- said selected range of STUMPS channels; and
- said selected range of STUMPS channel unload cycles.

20. The method of claim 1 wherein:

said signature generation mode includes a selected range of STUMPS channels and a selected range of STUMPS channel unload cycles; and said directing includes gating the inputs of the signature register active only for said selected range of STUMPS channels and said selected range of STUMPS channel unload cycles.

21. The method of claim 1 wherein said directing is implemented by external chip controls.

22. A method for isolating faults in an in an embedded array by running BIST on the array including the steps of:

forming a plurality of channels from array elements;

connecting an output of each channel to an input of a signature register;

storing a dynamically selectable range of BIST patterns in a test interval; and gating the inputs of the signature register active only for said range of BIST patterns.

23. A method for isolating faults in an in an embedded array by running BIST on the array including the steps of:

forming a plurality of channels from array elements;

connecting an output of each channel to an input of a signature register;

storing a dynamically selectable range of channels; and gating the inputs of the signature register active only for said range of channels.

24. A method for isolating faults in an in an embedded array by running BIST on the array including the steps of:

forming a plurality of channels from array elements;

connecting an output of each channel to an input of a signature register;

storing a dynamically selectable range of channel unload cycles; and gating the inputs of the signature register active only for said range of channel unload cycles.

* * * * *

UNITED STATES PATENT AND TRADEMARK OFFICE
CERTIFICATE OF CORRECTION

PATENT NO. : 6,442,723 B1 Page 1 of 1
DATED : August 27, 2002
INVENTOR(S) : Timothy J. Koprowski et al.

It is certified that error appears in the above-identified patent and that said Letters Patent is hereby corrected as shown below:

<u>Column 8,</u>
Line 11, after "in an" (first occurrence) delete "in an"
Line 20, after "in an" (first occurrence) delete "in an"
Line 28, after "in an" (first occurrence) delete "in an"

Signed and Sealed this

Twenty-fifth Day of February, 2003

JAMES E. ROGAN
*Director of the United States Patent and Trademark Office*